United States Patent
Schwab et al.

(10) Patent No.: US 8,070,882 B2
(45) Date of Patent: Dec. 6, 2011

(54) METHOD FOR THE WET-CHEMICAL TREATMENT OF A SEMICONDUCTOR WAFER

(75) Inventors: Guenter Schwab, Neuoetting (DE); Clemens Zapilko, Burghausen (DE); Thomas Buschhardt, Burghausen (DE); Diego Feijoo, Burghausen (DE); Teruo Haibara, Hikari Yamaguchi (JP); Yoshihiro Mori, Hikari Yamaguchi (JP)

(73) Assignee: Siltronic AG, Munich (DE)

( * ) Notice: Subject to any disclaimer, the term of this patent is extended or adjusted under 35 U.S.C. 154(b) by 266 days.

(21) Appl. No.: 12/326,969

(22) Filed: Dec. 3, 2008

(65) Prior Publication Data

US 2009/0145457 A1 Jun. 11, 2009

(30) Foreign Application Priority Data

Dec. 5, 2007 (DE) .......................... 10 2007 058 503

(51) Int. Cl.
 *B08B 7/00* (2006.01)
(52) U.S. Cl. .................. 134/2; 134/1; 134/1.3; 134/4
(58) Field of Classification Search ............... 134/1.3, 134/2, 3, 4
 See application file for complete search history.

(56) References Cited

U.S. PATENT DOCUMENTS

| | | | | |
|---|---|---|---|---|
| 4,871,416 A | * | 10/1989 | Fukuda | 438/708 |
| 5,560,857 A | * | 10/1996 | Sakon et al. | 510/175 |
| 5,759,971 A | | 6/1998 | Manako | |
| 6,517,998 B1 | * | 2/2003 | Noda et al. | 430/329 |
| 7,021,319 B2 | | 4/2006 | Verhaverbeke | |
| 7,037,842 B2 | * | 5/2006 | Verhaverbeke et al. | 438/704 |
| 2002/0050279 A1 | | 5/2002 | Bergman | |
| 2004/0029388 A1 | | 2/2004 | Verhaverbeke et al. | |
| 2004/0031503 A1 | | 2/2004 | Eitoku | |
| 2004/0097055 A1 | * | 5/2004 | Henley et al. | 438/471 |
| 2004/0226654 A1 | * | 11/2004 | Hongo et al. | 156/345.11 |
| 2005/0233922 A1 | * | 10/2005 | Jung et al. | 510/175 |
| 2006/0091110 A1 | | 5/2006 | Oh | |
| 2007/0068086 A1 | * | 3/2007 | Akatsuka | 51/307 |
| 2007/0084481 A1 | * | 4/2007 | Franklin | 134/1.3 |

FOREIGN PATENT DOCUMENTS

| | | |
|---|---|---|
| JP | 05152203 A | 6/1993 |
| JP | 2002110624 A | 4/2002 |
| JP | 2002134401 A | 5/2002 |
| JP | 2003045842 A | 2/2003 |
| JP | 2005268308 A | 9/2005 |
| JP | 2006116365 A2 | 5/2006 |
| JP | 2006-237095 A | 9/2006 |
| JP | 2006310456 A | 9/2006 |
| KR | 2001-56346 A | 7/2001 |
| KR | 2002-76563 A | 10/2002 |
| WO | 0127986 A1 | 4/2001 |

* cited by examiner

*Primary Examiner* — Michael Kornakov
*Assistant Examiner* — Katelyn Whatley
(74) *Attorney, Agent, or Firm* — Brooks Kushman P.C.

(57) ABSTRACT

A method for the wet-chemical treatment of a semiconductor wafer involves: a) rotating a semiconductor wafer; b) applying a cleaning liquid comprising gas bubbles having a diameter of 100 μm or less to the rotating wafer such that a liquid film forms on the wafer; c) exposing the rotating semiconductor wafer to a gas atmosphere containing a reactive gas; and d) removing the liquid film from the wafer.

19 Claims, No Drawings

METHOD FOR THE WET-CHEMICAL TREATMENT OF A SEMICONDUCTOR WAFER

CROSS-REFERENCE TO RELATED APPLICATIONS

This application claims priority to German application DE 10 2007 058 503.0 filed Dec. 5, 2007, which is herein incorporated by reference.

BACKGROUND OF THE INVENTION

1. Field of the Invention

The invention relates to a method for the wet-chemical treatment of a semiconductor wafer.

2. Background Art

Semiconductor wafers required for producing electronic components regularly have to be cleaned of particles and metal contaminants. Such cleaning steps are customary, and are performed both by the manufacturers of the electronic components and by the suppliers thereof: the manufacturers of the semiconductor wafers. Individual-wafer cleaning and batch cleaning methods are known. The present invention relates to individual-wafer cleaning methods.

Individual-wafer cleaning is based on the principle of a rotating semiconductor wafer, wherein a liquid film forms on the surface of the semiconductor wafer which is to be cleaned. Individual-wafer cleaning is advantageous for numerous reasons, one such reason being a smaller consumption of cleaning liquid. Aqueous solutions containing hydrogen fluoride (HF) and ozone ($O_3$) have proven to be effective cleaning liquids, see e.g. U.S. Pat. No. 5,759,971.

U.S. Pat. No. 7,037,842 B2 describes a method in which a surface of a rotating semiconductor wafer is sprayed with an aqueous cleaning liquid containing e.g. HF and $O_3$. By way of example, hydrogen ($H_2$) and nitrogen ($N_2$) are also known as alternative constituents of the cleaning liquid.

U.S. Pat. No. 7,021,319 B2 discloses exposing the rotating semiconductor wafer to sound waves in order to increase the effectiveness of the cleaning process. In the center of the semiconductor wafer rotating about its central axis, a bulge of the liquid film occurs on account of the surface tension and the vanishing centrifugal force there, which can be reduced by adding an alcohol and reducing the surface tension. As an alternative, the bulge is reduced by physical forces, for example by blowing $N_2$ gas onto the bulge.

A suitable apparatus for carrying out an individual-wafer cleaning method is described in US 2002/0050279 A1. The systems of the design series Raider SP from Semitool/USA are particularly well suited for these methods. US 2002/0050279 A1 also discloses a method which serves to enable sufficient diffusion of a gas through a liquid film applied to a rotating semiconductor wafer. The thickness of the liquid film is reduced by the fast rotation of the semiconductor wafer. The thinner the film, the faster a gas can diffuse through the film. However, for this reason, the thickness of the liquid film is a limiting parameter for the concentration of the gas component on the surface of the semiconductor wafer.

SUMMARY OF THE INVENTION

It was an object of the invention to provide a particularly efficient method for the wet-chemical treatment of semiconductor wafers with improved diffusion of a gas component in the liquid film. These and other objects are achieved by means of a method wherein a cleaning liquid containing microbubbles is applied to a rotating wafer to form a film, the rotating wafer is exposed to an atmosphere containing a reactive gas, and the liquid film is then removed.

DETAILED DESCRIPTION OF THE PREFERRED EMBODIMENT(S)

The invention thus consists, inter alia, in combining the chemical effect of acidic HF- and ozone-containing cleaning solutions with the physical effect of small gas bubbles (microbubbles) produced in the cleaning liquid. Moreover, it has been found that such microbubbles are suitable for accelerating the transport of reactive gases through cleaning liquids.

Microbubbles are preferably used in an acidic solution containing hydrogen fluoride or hydrogen chloride. Microbubbles are also used in HF and ozone-containing cleaning liquids that etch the surface of silicon wafers. Surface particles are undercut and thereby stripped from the surface. The free particles are adsorbed at the microbubbles and transported away by the bubbles in the flow of the liquid.

In the method according to the invention, a cleaning liquid containing such microbubbles is distributed on a rotating semiconductor wafer via an inlet. The semiconductor wafer is preferably a silicon wafer, however, the method is also suitable for the treatment of SOI and GeOI wafers (SOI, GeOI="Silicon/Germanium-on-insulator"), coated wafers, wafers with functional layers or layer structures, in particular including wafers with silicon/germanium layers. The method is preferred in particular for semiconductor wafers having a diameter of 300 mm or 450 mm.

The rotational speed of the semiconductor wafer is preferably 20-600 rpm, more preferably 100-500 rpm, and most preferably 200-400 rpm. A thin liquid film containing a large number of microbubbles forms on the semiconductor wafer. A reactive gas such as ozone is preferably supplied via the gas phase. The microbubbles facilitate the diffusion of the gas through the liquid film to the surface of the semiconductor wafer.

One advantage of the invention is that improved particle cleaning is achieved by combining microbubbles with a cleaning chemical that etches silicon surfaces. Moreover, an improved gas transport (diffusion) of reactive gases in cleaning liquids arises as a result of the presence of microbubbles. This facilitates the oxidation and removal of organic contaminants and metal-containing contaminations. Furthermore, the bulge of the liquid film in the center of the wafer that is observed in the prior art is reduced by the use of microbubbles.

In the context of the present invention, microbubbles should be understood to be gas bubbles having a diameter of 100 μm or less. Such microbubbles have a comparatively large surface-to-volume ratio. Furthermore, the long-term stability of microbubbles in aqueous media and the capability of adsorbing hydrophobic and amphiphilic substances on their surface should be regarded as particularly advantageous.

The subject of the invention is explained in detail below on the basis of preferred configurations. Microbubbles can in principle be produced from inert gases or from reactive gases. Examples of inert gases are air, nitrogen and argon. Examples of suitable reactive gases are hydrogen, carbon dioxide and ozone.

The stability of microbubbles in water can be increased further by adding amphiphilic substances to aqueous solutions. By way of example, anionic or nonionic surfactants, fatty acids, fatty alcohols or ethylene glycols are suitable.

The microbubbles themselves are produced e.g. in special nozzles in which gas and liquid are mixed. A further possibility is for the bubbles to be produced by means of a centrifugal pump. A suitable apparatus for producing microbubbles is available from Nanoplanet Co. Ltd, cf. JP 2006116365 A2.

The method according to the invention for cleaning a semiconductor wafer consists in the semiconductor wafer being rapidly rotated and a cleaning solution containing microbubbles simultaneously being sprayed onto the wafer surface. The cleaning solution preferably comprises hydrogen fluoride (HF). A cleaning liquid comprising hydrogen chloride (HCl) or a combination of HCl and HF is likewise preferred.

The microbubbles are preferably composed of a reactive gas that oxidizes silicon surfaces. Ozone and mixtures of ozone with oxygen or air are particularly preferred. When the cleaning solution contacts the semiconductor wafer, a liquid film forms on the wafer, and is thinned by the rotation of the wafer preferably to a thickness of 1-100 μm. Typically, a liquid film having a thickness of 50-100 μm is produced by a rotational speed of 50-300 rpm.

The microbubbles adsorb at the surface of the semiconductor wafer, combine to form larger bubbles or burst. These mechanical processes have the effect that the liquid film is locally swirled, regions with turbulent flow arise or the liquid film completely breaks up at individual locations. Surface particles are stripped from the wafer by the forces occurring and are transported into the bulk of the liquid film.

On account of the high rotational speed of the wafer, the contact time of a volume element of the cleaning solution with the wafer surface is very short. The long-term stability of the microbubbles, which is of crucial importance when the microbubbles are employed in cleaning baths, is therefore unimportant for the method according to the invention. The use of surface-active substances for stabilizing the bubbles is possible, but not absolutely necessary.

In order to ensure a highest possible density of homogeneously distributed microbubbles in the cleaning solution on the semiconductor surface, it is advantageous to produce the microbubbles directly before the liquid contacts the wafer, that is to say at the "Point of use".

The stripping of particles from the surface is supported by the chemical effect of the cleaning solution. On account of their high surface-to-volume ratio, microbubbles enable rapid gas diffusion from the bubbles into the surrounding liquid. In dilute hydrofluoric acid, therefore, ozone-containing microbubbles form a mixture of hydrogen fluoride and dissolved ozone. This mixture is able to etch silicon surfaces. In this case, silicon dioxide present in a thin layer on the surface of the semiconductor wafer is dissolved by hydrogen fluoride. The exposed silicon is immediately oxidized again by ozone. Both processes together thus produce a continuous removal of silicon. Particles that adhere on the surface are undercut. Together with the mechanical effect of the microbubbles this enables efficient removal of particles.

In a second configuration of the invention, microbubbles are used to facilitate and accelerate the diffusion of a gas through a liquid film. A liquid containing microbubbles is distributed on a rotating semiconductor wafer. The semiconductor wafer is situated in a process chamber into which a gas component is then additionally fed. The gas diffuses through the liquid film to the wafer surface and manifests a chemical effect there, such as e.g. etching the silicon, oxidizing organic compounds, dissolving metallic contaminants.

Microbubbles improve the gas transport through the liquid film. The inventors assume that three different mechanisms are responsible for this:

a) A microbubble is charged with the gas component at the surface of the liquid film and then moves with the flowing liquid to the wafer surface.

b) Regions of turbulent or intensified laminar flow arise as a result of the movement of the microbubbles in the liquid or their bursting at the liquid surface. Gas transport through the liquid film takes place in these regions not only by diffusion but additionally to an intensified extent by convective substance transport.

c) Since the diameter of the microbubbles corresponds approximately to the thickness of the liquid film at high rotational speeds of the semiconductor wafer, the diffusion of a gas takes place principally through the gas space of the microbubbles. The diffusion of a gas through another gas is significantly faster than the diffusion of a gas through a liquid.

Gases which are usually used for the cleaning of semiconductor wafers are suitable as the gas component. Without restricting the scope of the invention, the following shall be mentioned as particularly suitable gases: ozone, ammonia, hydrogen fluoride, hydrogen chloride, hydrogen and carbon dioxide.

Inert gases or likewise gases that perform a specific chemical function can also be used for producing the microbubbles. Examples are air, nitrogen, argon, helium as inert gases and $O_2$ or ozone (produce oxidizing atmosphere), hydrogen (reducing microbubbles) or carbon dioxide (reacts in acidic fashion in aqueous solutions).

In one preferred configuration of the invention, the liquid distributed on the rotating semiconductor wafer contains hydrogen fluoride. The HF concentration is preferably 0.02-2%, more preferably 0.05-0.5%, and most preferably 0.05-0.15%. The microbubbles produced in the HF solution preferably contain an inert gas, e.g. nitrogen or air. The temperature of the cleaning solution is preferably between 5 and 70° C.

The gas component fed from the surrounding gas space is preferably ozone or a mixture of ozone with oxygen or air. The concentration of ozone in an oxygen/ozone mixture is preferably 100-300 grams per standard cubic meter [$g/m^3$ (stp)]. The etching and oxidizing effect of an ozone-HF mixture enables effective particle cleaning together with complete removal of organic and metal-containing compounds.

In a further preferred configuration of the method according to the invention, microbubbles comprising an inert gas such as nitrogen, air or argon are produced in an alkaline aqueous solution. Ammonia, tetramethylammonium hydroxide (TMAH) or potassium carbonate are suitable as alkaline component(s). Other basic additives are also conceivable, in particular organic amines and alkali metal hydroxides. This solution is applied to the semiconductor wafer. Ozone is indiffused into the liquid via the gas phase.

Such a combination of alkaline and oxidizing chemicals with microbubbles is particularly suitable for removing organic contaminants on the semiconductor wafer.

A third configuration of the invention serves for completely removing surface oxide layers from semiconductor wafers and for producing an oxygen-free semiconductor surface. Deionized water containing microbubbles of hydrogen gas is sprayed onto the rotating semiconductor wafer. HF gas is introduced into the process chamber. A solution of HF and hydrogen in water arises. A comparable mixture can also be obtained from dilute hydrofluoric acid comprising microbubbles composed of an inert gas, and hydrogen indiffusing via the gas phase.

This solution is able to remove the native oxide layer on semiconductor surfaces (reaction of silicon dioxide with HF to form silicon tetrafluoride). The reducing hydrogen atmosphere prevents an oxide layer from forming anew.

The application of this method is not restricted to silicon wafers, but also extends to other semiconductor materials such as e.g. alloys of silicon and germanium. The positive effect of the microbubbles on the removal of particles can additionally be intensified by using ultrasound or megasound.

Removal of the film from the semiconductor wafer may be made by or augmented by rinsing with ultrapure, deionized water, ozone-containing ultrapure water, SC1 solution, or dilute hydrochloric acid. The ultrapure water used is that conventionally used in rinsing of semiconductor wafers.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for the individual wet-chemical treatment of a semiconductor wafer, comprising: a) rotating a semiconductor wafer; b) distributing a cleaning liquid comprising gas bubbles having a diameter of 100 μm or less onto the surface of the rotating semiconductor wafer, such that a liquid film having a thickness of greater than or equal to 1 μm and less than or equal to 100 μm forms on the semiconductor wafer surface; c) exposing the rotating semiconductor wafer and liquid film to a gas atmosphere containing a reactive gas, wherein the reactive gas diffuses through the gas space of the microbubbles in the liquid film from the gas atmosphere and contacts the wafer surface; and d) removing the liquid film.

2. The method of claim 1, wherein the gas bubbles comprise a gas or a gas mixture of at least one gas selected from the group consisting of air, nitrogen, argon, helium, hydrogen, carbon dioxide, and ozone.

3. The method of claim 1, wherein the semiconductor wafer is rotated at a speed of 20-600 rpm.

4. The method of claim 1, wherein the liquid film has a thickness of 50-100 μm and the rotational speed of the semiconductor wafer is 50-300 rpm.

5. The method of claim 1, wherein the wet-chemical treatment of the semiconductor wafer in accordance with b) and c) is effected for 30-200 s.

6. The method of claim 5, wherein the wet-chemical treatment of the semiconductor wafer is effected for 30-60 s.

7. The method of claim 1, wherein the liquid film is removed in step d) by rinsing with ultrapure water, ozone-containing ultrapure water, SC1 solution or dilute hydrochloric acid.

8. The method of claim 1, wherein the semiconductor wafer is a silicon wafer, an SOI wafer, a GeOI wafer or a silicon wafer having a silicon-germanium layer.

9. The method of claim 1, wherein the rotating semiconductor wafer is exposed to a gas atmosphere of at least one reactive gas selected from the group consisting of ozone, ammonia, hydrogen fluoride, hydrogen chloride, hydrogen, carbon dioxide, and mixtures of these gases with oxygen or air.

10. The method of claim 9, wherein the gas atmosphere comprises an ozone/oxygen mixture or an ozone/oxygen/nitrogen mixture having an ozone concentration of 100-300 g/m$^3$ (stp) (gram per standard cubic meter).

11. The method of claim 1, wherein the cleaning liquid comprises hydrogen fluoride or hydrogen chloride or a combination of hydrogen fluoride and hydrogen chloride.

12. The method of claim 11, wherein the cleaning liquid contains hydrogen fluoride with a concentration of 0.02-2%.

13. The method of claim 1, wherein the cleaning liquid comprises at least one alkaline component selected from the group consisting of ammonia, tetramethylammonium hydroxide, organic amines, alkali metal hydroxides, and alkali metal carbonates, and wherein the rotating semiconductor wafer is exposed to an ozone atmosphere.

14. The method of claim 1, wherein the cleaning liquid comprises deionized water and hydrogen gas bubbles and the rotating semiconductor wafer is exposed to a gas atmosphere of hydrogen fluoride.

15. The method of claim 1, wherein the cleaning liquid comprises dilute hydrofluoric acid, gas bubbles composed of at least one inert gas selected from the group consisting of air, nitrogen and argon, and wherein the rotating semiconductor wafer is exposed to an atmosphere comprising hydrogen.

16. The method of claim 1, wherein at least one amphiphilic substance selected from the group consisting of ionic surfactants, nonionic surfactants, fatty acids, fatty alcohols and ethylene glycols is added to the cleaning liquid.

17. A method for the individual wet-chemical treatment of a semiconductor wafer, comprising placing the semiconductor wafer into a process chamber containing a gas atmosphere; supplying a liquid containing microbubbles having a diameter of 100 μm or less and distributing said liquid onto the surface of the wafer; rotating the wafer at a rotational speed, the rotational speed causing the liquid to form a liquid film having a film thickness of 1 to 100 μm on the surface of the wafer, the thickness of the film being regulatable by adjusting the rotational speed of the wafer, the film being exposed to the gas atmosphere of the reaction chamber; supplying a reactive gas to the gas atmosphere in the reaction chamber such that the reactive gas diffuses through the gas space of the microbubbles in the liquid film from the gas atmosphere and contacts the wafer surface; and removing the liquid film from the wafer.

18. The method of claim 17, wherein the rotational speed of the wafer is between 50 and 300 rpm.

19. The method of claim 17 wherein the step of distributing comprises spraying the liquid onto the rotating wafer.

* * * * *